US006906613B1

(12) United States Patent
Tamura

(10) Patent No.: US 6,906,613 B1
(45) Date of Patent: Jun. 14, 2005

(54) KEYLESS ENTRY SYSTEM

(75) Inventor: Shigeaki Tamura, Niigata (JP)

(73) Assignee: Nippon Seiki Co., Ltd., Niigata (JP)

( * ) Notice: Subject to any disclaimer, the term of this patent is extended or adjusted under 35 U.S.C. 154(b) by 586 days.

(21) Appl. No.: 09/786,157

(22) PCT Filed: Jun. 26, 2000

(86) PCT No.: PCT/JP00/04196

§ 371 (c)(1),
(2), (4) Date: Mar. 1, 2001

(87) PCT Pub. No.: WO01/06806

PCT Pub. Date: Jan. 25, 2001

(30) Foreign Application Priority Data

Jul. 15, 1999 (JP) .......................................... 11-201052

(51) Int. Cl.[7] .......................... G05B 19/00; H04Q 9/00; H02G 3/00; H05K 1/14; H04B 1/02

(52) U.S. Cl. ..................... 340/5.64; 307/10.1; 361/736; 455/91

(58) Field of Search ............................... 340/5.64, 5.62, 340/5.72, 825.69, 528.72, 825.64, 426, 426.7; 307/10.1, 10.2; 343/711; 361/736, 737, 750, 762, 784, 785, 795, 799; 455/91, 95, 114.2, 117, 128

(56) References Cited

U.S. PATENT DOCUMENTS 3,751,664 A * 8/1973 Falbel ........................ 250/353
4,835,531 A * 5/1989 Sato ....................... 340/825.69
6,078,293 A * 6/2000 Yamamoto .................. 343/713
6,426,468 B1 * 7/2002 Utsunomiya et al. ....... 174/261
6,694,200 B1 * 2/2004 Naim .......................... 700/94

FOREIGN PATENT DOCUMENTS

| | | | |
|---|---|---|---|
| JP | 8-216735 | 8/1996 | |
| JP | 196 05 663 | 8/1996 | |
| JP | 9-275360 | 10/1997 | |
| JP | 09303016 | * 11/1997 | ........... E05B/49/00 |
| JP | 10-145121 | 5/1998 | |
| JP | 10-154953 | 6/1998 | |
| JP | 11-27023 | 1/1999 | |

* cited by examiner

*Primary Examiner*—Michael Horabik
*Assistant Examiner*—Scott Au
(74) *Attorney, Agent, or Firm*—McDermott Will & Emery LLP

(57) ABSTRACT

A keyless entry system comprising a transmitter for transmitting binary pulse signals including a specific identification code by the operation of the user, a receiver for receiving said signals from the transmitter via an antenna, and a controlling section for supplying output signals for making the action intended by said user implemented when said identification code received by said receiver and the register code stored in the storage section are determined to be identified is provided. The ground of the receiving section and the ground of the controlling section are electrically connected.

7 Claims, 5 Drawing Sheets

KEYLESS ENTRY SYSTEM

BACKGROUND OF THE INVENTION

1. Field of the Invention

The present invention relates to a keyless entry system mounted, for example, on the four-wheel vehicle (hereinafter referred to as vehicle).

2. Description of the Related Art

A wireless keyless entry system using a feeble electric current intended for use in the vehicle is already put into actual use. It is constructed in such a manner that a signal including the identification code supplied from the transmitter provided as a portable electronic key (remote controller) by the operation of the user such as a driver is received by the receiver via an antenna, and when the identification code is determined to be correct, the action intended by said user, such as the open/close operation of the door lock, is controlled.

In many cases, the receiver in such a system is disposed in the trunk room or in the dashboard, and the antenna is installed on the rear glass or the upper portion of the dashboard remote from the receiver. Therefore, the wiring connecting the antenna and the receiver requires a shielding process in order to prevent external noise that may enter from the environment, whereby the cost may be increased.

As a measure to solve this problem, a structure having a receiver integrated within the combination meter mounted in front of the driver's seat, and an antenna is mounted on the meter board or in the meter housing is disclosed in the Japanese Patent Laid-Open No.8-216735. In this arrangement, the shielding process is eliminated and the number of the component may be reduced, thereby realizing reduction of the cost.

However, in this system, the high receiving sensitivity is required as a matter of course. Though the most effective measure to realize the high receiving sensitivity is upsizing of the antenna, it has been difficult to realize since mounting of the antenna on the combination meter is physically limited due to the size of the meter.

SUMMARY OF THE INVENTION

With such a problem in view, it is an object of the present invention to provide a keyless entry system in which the antenna is mounted on the combination meter while improving the receiving sensitivity.

The keyless entry system according to the first aspect of the invention comprises a transmitter 200 for transmitting binary pulse signals including a specific identification code by the operation of the user, a receiver 130 for receiving said signals from the transmitter 200 via an antenna 131, and a controlling section 140 for supplying output signals for making the action intended by said user implemented when said identification code received by said receiver 130 and the registered code stored in the storage section are determined to be identical, wherein the sensitivity of the antenna 131 is improved by electrically connecting a ground 134*a* of the receiving section 130 and a ground 149*a* of the controlling section 140.

The keyless entry system according to the second aspect of the invention comprises a transmitter 200 for transmitting binary pulse signals including a specific identification code by the operation of the user, a receiver 130 for receiving said signals from the transmitter 200 via an antenna 131, and a controlling section 140 for supplying output signals for making the action intended by said user implemented when said identification code received by said receiver 130 and the registered code stored in the storage section are determined to be identical, wherein the sensitivity of the antenna 131 is improved by forming said receiving section 130 in a unit that is attachable and detachable with respect to the controlling section 140 and forming connecting portions 133, 145 in the receiving section 130 and the controlling section 140 respectively for electrically connecting the ground 134*a* of the receiving section 130 and the ground 149*a* of the controlling section 140 by mounting the receiving section 130 on the controlling section 140. Especially, it is realized in a simple structure just by providing connecting portions 133 and 145 including at least two conductive terminals and connecting at least one of them to the ground 134*a* and 149*a*.

The keyless entry system according to the third aspect of the invention comprises a transmitter 200 for transmitting binary pulse signals including a specific identification code by the operation of the user, a receiver 130 for integrally or externally mounted to the combination meter mounted in front of the driver's seat of the vehicle so as to receive said signals from the transmitter 200 via the antenna 131, is a controlling section 140 integrally mounted on said meter for controlling said meter and supplying output signals for making the action intended by said user implemented when said identification code received by said receiver 130 and the registered code stored in the storage section are determined to be identical, wherein the sensitivity of the antenna 131 can be improved by electrically connecting the ground 134*a* of the receiving section 130 and the ground 149*a* of the controlling section 140.

The keyless entry system according to the fourth aspect of the invention comprises a transmitter 200 for transmitting binary pulse signals including a specific identification code by the operation of the user, a receiver 130 for integrally or externally mounted to the combination meter mounted in front of the driver's seat of the vehicle so as to receive said signals from the transmitter 200 via the antenna 131, and a controlling section 140 integrally mounted on said meter for controlling said meter and supplying output signals for making the action intended by said user implemented when said identification code received by said receiver 130 and the registered code stored in the storage section are determined to be identical, wherein the sensitivity of the antenna 131 is improved by forming said receiving section 130 in a unit that is attachable and detachable with respect to said meter and forming connecting portions 133, 145 in the receiving section 130 and the controlling section 140 respectively for electrically connecting the ground 134*a* of the receiving section 130 and the ground 149*a* of the controlling section 140 by mounting the receiving section 130 on said meter. Especially, it is realized in a simple structure just by providing connecting portions 133 and 145 including at least two conductive terminals and connecting at least one of them to the ground 134*a* and 149*a*.

BRIEF DESCRIPTION OF THE DRAWINGS

FIG. 2 is in use;

DESCRIPTION OF THE PREFERRED EMBODIMENTS

Figure 1:
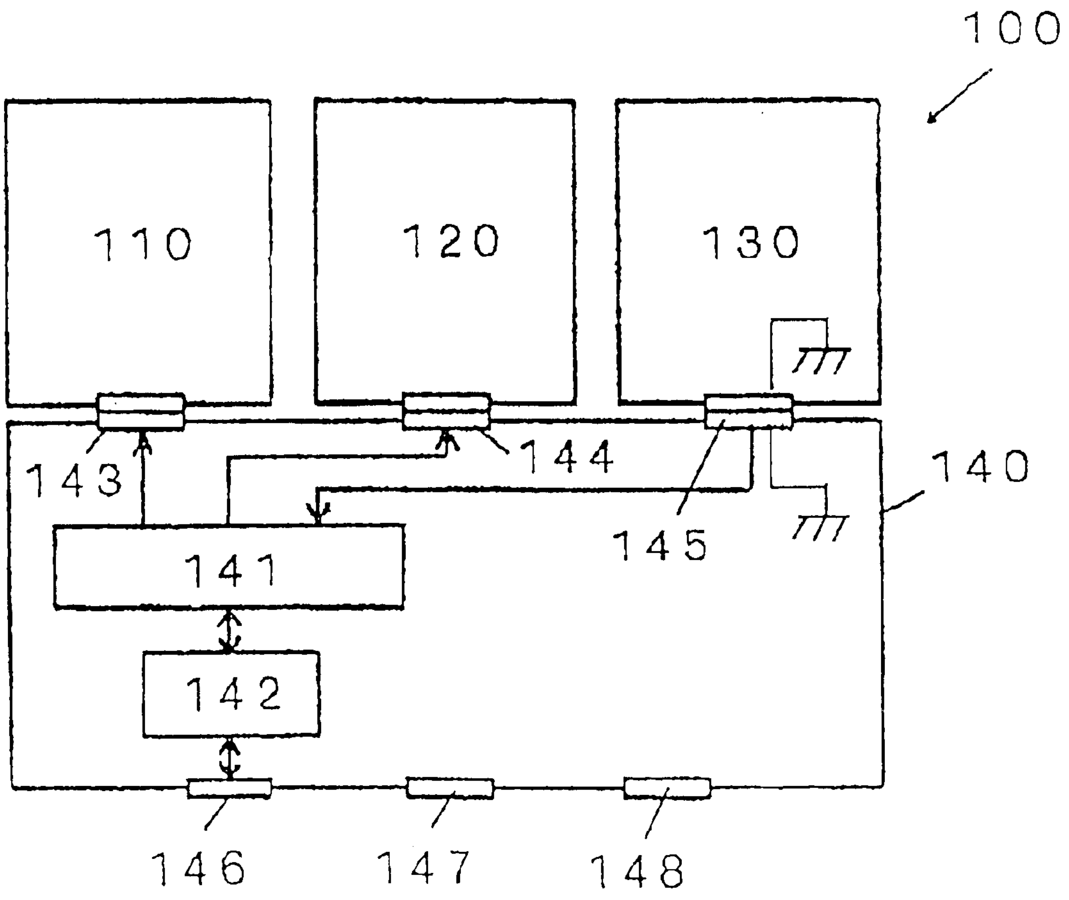
FIG. 1 is a block diagram showing the structure of an embodiment of the present invention.

Referring now to the drawings, the present invention will now be described.

FIG. 1 to FIG. 5 show an instrument apparatus 100 for the vehicle (combination meter) to be installed in front of the driver according to an embodiment of the present invention, wherein the main unit comprises a display unit 110 for providing visual displays according to various states of the vehicle, an audio unit 120 for providing acoustic displays according to said various states of the vehicle, and a receiving unit 130 for supplying signals for controlling the vehicle in response to radio information from the outside.

Figure 2:
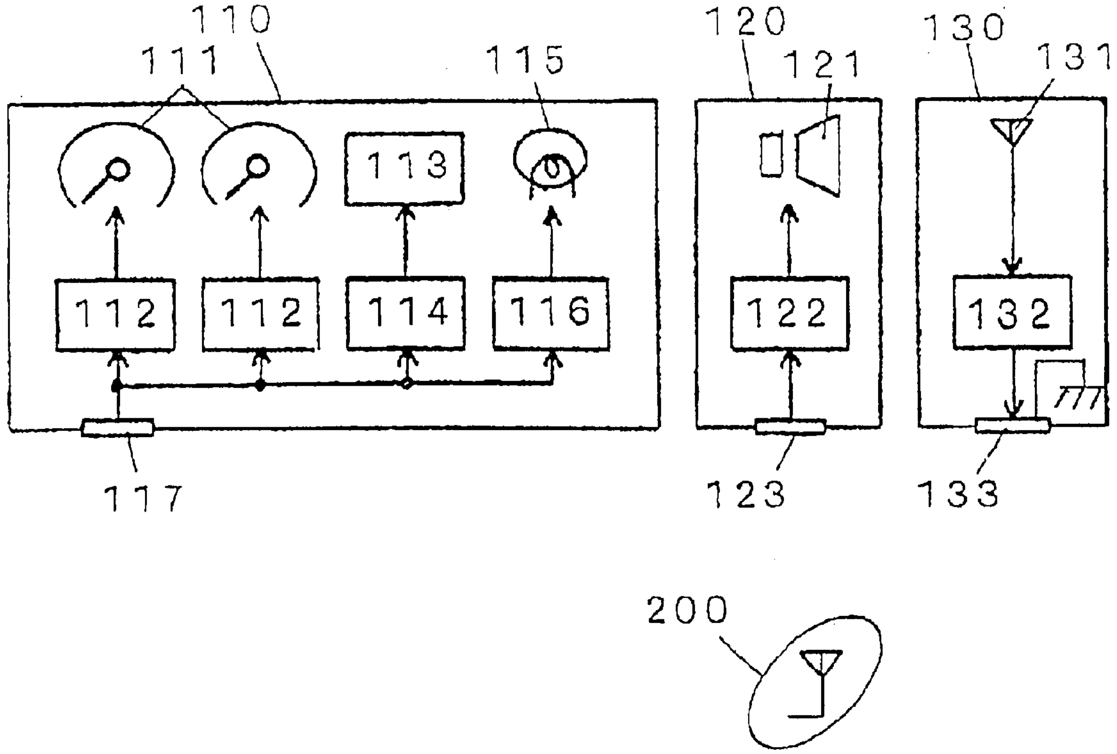
FIG. 2 is a block diagram showing the main portion of the embodiment of FIG. 1.

The display unit 110 is intended for indication of various information on the vehicle as shown in FIG. 2, and comprises, for example, at least one instrument body 111 of cross coil type or stepping motor type for indicating a driving speed, the number of revolution of the engine, and the quantity of residual fuel by the angular degrees of the needle, a drive circuit 112 provided in association with the instrument body 111 for supplying signals to drive the instrument body 111, a displaying element 113 such as LCD, EL, or EC for displaying the travel distance or the distance from the point to point by digital numbers or an analogue bar, a drive circuit 114 provided in association with the display element 113 for supplying signals to drive the display element 113, a lamp for illuminating various indicators such as a direction indicator, a light illumination indicator, or a seat belt wearing state indicator, a display element 115 such as LED, and a drive circuit 116 provided in association with the display element 115 for supplying signals to drive the display element 115.

The alarm unit 120 is intended for giving the driver a prescribed alarm as needed according to the state of the vehicle as shown in FIG. 2, and comprises, for example, a sounding element 121 such as a buzzer that gives an alarm sound by the operation of the driver or by the output of the sensors installed at adequate locations as needed, and a drive circuit 122 provided in association with the sounding element 121 for supplying signals to drive the sounding element 121. The sounding element 121 may be mounted independently, or in association with a loudspeaker (not shown) that is installed at other location of the vehicle.

The receiving unit (receiver) 130 is intended for making the control unit described later perform a prescribed process in response to radio information from the outside as shown in FIG. 2, and comprises, for example, an antenna 131 for receiving radio wave signals from the remote controller (transmitter) 200 for the keyless entry system, and a receiving section 132 connected to the antenna 131 for subjecting said signals processes such as noise elimination process or a waveform shaping process and supplying said processed signal.

The reference numeral 140 denotes a control unit for controlling the respective main units 110 to 130 and the electrical equipment unit installed at each location of the vehicle described later, and comprises a control element 141 such as a microcomputer and a communication interface 142 for communicating control information with the control element 141 and receiving the output from the sensors installed at an adequate locations of the vehicle.

The respective main units 110 to 140 are detachably connected by the connecting means 117, 123, 133, 143, 144, 145 such as connectors. The controlling unit 140 comprises a connecting means 146 such as a connector to be connected to a multiplex communication line described below and a connecting means 147 to be connected to the communication line (not shown) other than said multiple communication line, and a connecting means 148 to be connected to the power source line, not shown. The components such as circuits relating to the connecting means 147, 148 in the controlling unit 140 are not shown.

Figure 3:
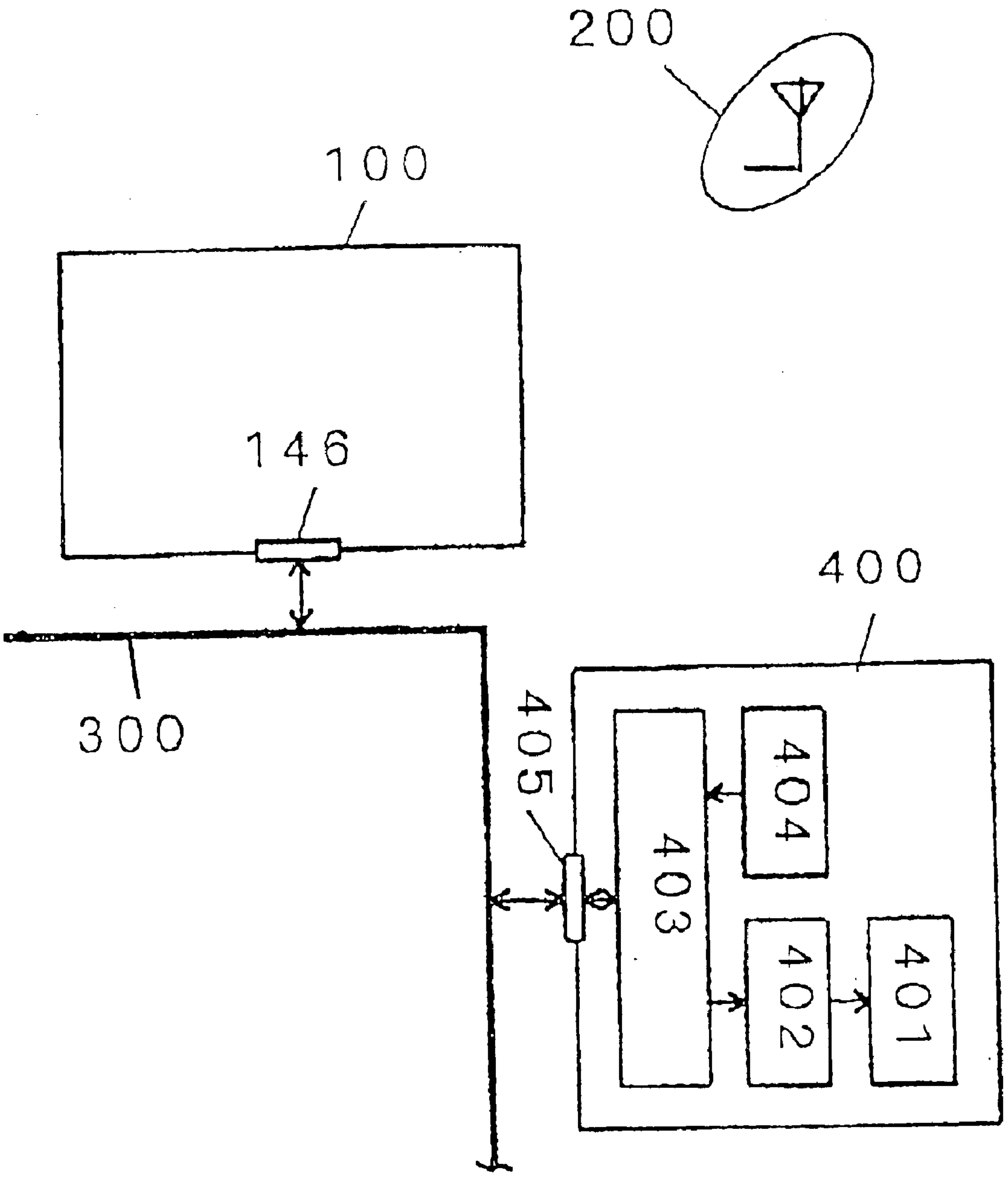
FIG. 3 is a block diagram showing a state in which the embodiment of FIG. 1.

In this embodiment, a display unit 110, an alarm unit 120, a receiving unit 130, and a controlling unit 140 are disposed at the location where the conventional combination meter is situated, and other electric equipments provided in the vehicle, not shown, are controlled concentrically by the controlling unit 140. In other words, as shown in FIG. 3, the instrument apparatus for the vehicle 100 is connected to the multiplex communication line 300 running throughout the vehicle via the connecting means 146.

The door module installed on each door (electric equipment unit) 400 comprises an actuator (electric equipment) 401 for locking or unlocking the door lock, a driving unit 402 for controlling the actuator 401, a communication interface 403 for controlling the actuator 401 via the driving unit 402 according to the instruction from the controlling element 141 of the meter driving device 100, and a switch 404 for locking and unlocking the door lock and moving the window up and down, and is connected to the multiplex communication line (signal path) 300 via the connecting means 405 such as a connector.

Control of the door lock in this structure is carried out as follows. In other words, the receiving unit 130 in the instrument apparatus for the vehicle 100 receives door open/close information from the remote controller 200. Then the controlling element 141 of the controlling unit 140 reads information received by the receiving unit 130, and, to be specific, when the identification code received at the receiver 130 and the registered code stored in the storage section (provided in the controlling unit 140 and may be integrated with the controlling element 141) are determined to be identical, the result or the instruction is transmitted to each door module 400 via the multiplex communication line 300 so that the door module 400 drives the actuator 401 by the driving unit 402. The door module 400 mounted on each door can lock and unlock the door lock or move the window up and down independently by the switch 404. The door module 400 mounted on the door at the driver's seat can lock and unlock the door lock move the window up and down at the driver's seat by driving the actuator 401 by the driving unit 402, and in addition, it is capable of transmitting the operating signals from the switch 404 to the control unit 140 via the multiplex communication line 300, and reading them at the control element 141, then transmitting the result to each door module 400 to lock and unlock the door lock or to move the window up and down at each location.

Figure 4:
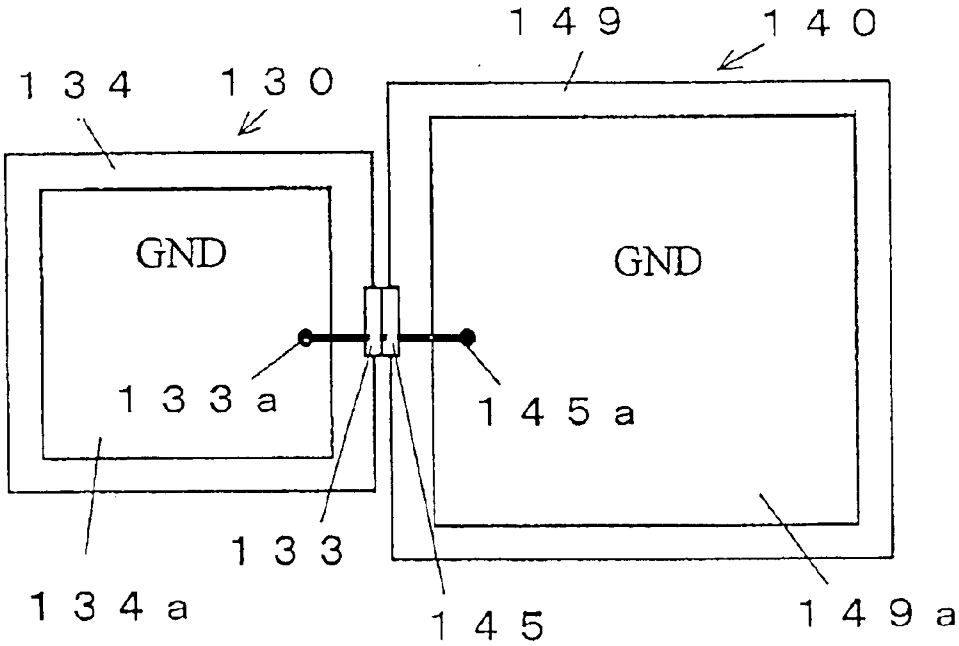
FIG. 4 is a diagrammatic sketch explaining the relation between the receiving unit and the control unit of the same embodiment.
Figure 5:
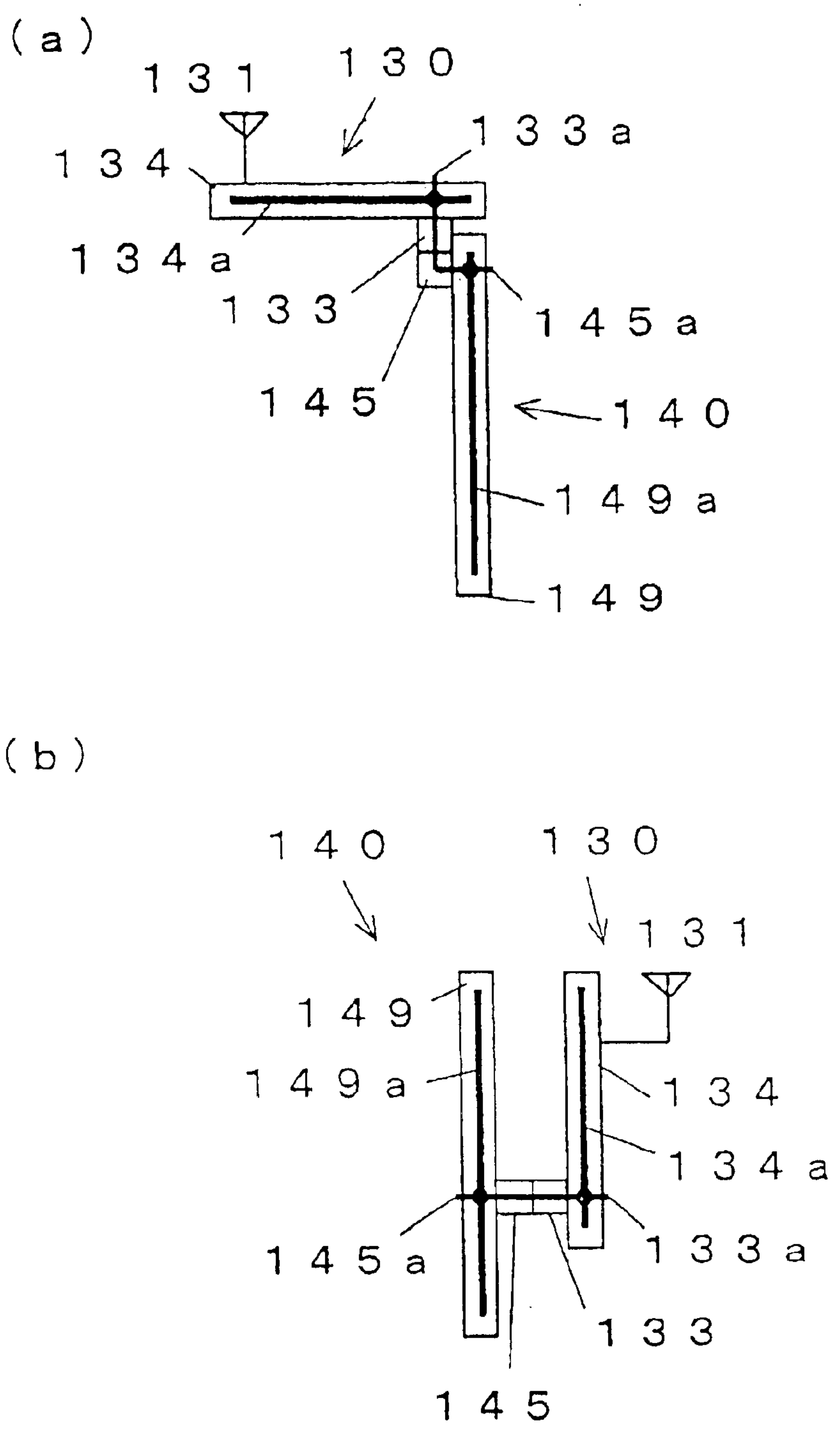
FIG. 5 is a diagrammatic sketch explaining the relation between the receiving unit and the control unit of the same embodiment.

As shown in FIG. 4, the receiving unit 130 and the control unit 140 are formed respectively on the independent substrates 134 and 149, and both substrates are physically connected by the connector (connecting portion) 133, 145, and the points of grounding potentials 134*a*, 149*a* of both substrates 134, 149 (GND; ground) are electrically connected. To be more concrete, as shown in FIG. 5, the substrate 134 of the receiving unit 130 and the substrate 149 of the controlling unit 140 may be connected perpendicularly (FIG. 5A) or in parallel (FIG. 5B), which may be selected according to the relation with the shape of the combination meter. Therefore, although the connectors 133, 145 as connecting portions have at least two conductive terminals respectively (not shown), since it is essential only that at least one of said two conductive terminals 133*a*, 145*a* is respectively connected to the ground 134*a*, 149*a*, the structure may be prevented from being complicated.

In this structure, the substrate 134 serves as a bottom board of the antenna 131 so that the grounds 134*a* and 149*a* of the grounded substrates 134, 149 exhibit the mirror effect to form an imaginary antenna of electric image aside from the antenna 131, whereby the same effect as the case where the antenna 131 is upsized is exerted, thereby increasing the benefit of the antenna 131.

In order to ensure the sufficient effect and efficiency, it is desired that the grounds 134*a*, 149*a* have large areas respectively, for example by forming both substrates 134, 149 by multilayer substrates respectively so that the respective one of those layers are used as grounds 134*a*, 149*a*.

According to the present invention, the receiving unit (receiver) is integrated in the combination meter mounted on the surface in front of the driver's seat and an antenna is provided in the receiving unit, so that the number of components is reduced and the shielding process is eliminated, whereby the cost reduction is realized.

Since the receiving unit and the controlling unit for controlling the same is formed on the independent substrates respectively, and the points of grounding potentials on those substrates electrically connected, the same effect as the case where the antenna is upsized is exerted and thus the benefit on the antenna is increased, whereby the receiving sensitivity is improved.

What is claimed is:

1. A keyless entry system comprising:

a transmitter for transmitting a radio wave signal by operation of a user;

a receiver formed on a first multilayer substrate for receiving the signal from the transmitter via an antenna; and a controller formed on a second multilayer substrate for controlling action as indicated by the signal, wherein at least one layer of the first multilayer substrate and at least one layer of the second multilayer substrate are electrically connected to a common ground so as to exhibit a mirror effect for enhancing receiving sensitivity of an antenna connected to the receiver.

2. The keyless entry system according to claim 1, wherein the receiver is attachably connectable to the controller at a connection interface for the receiver and the controller for electrically connecting a ground terminal of the receiver and a ground of the controller to the common ground.

3. The keyless entry system according to claim 1, wherein the receiver and the controller are mounted corresponding to a combination meter, which is mounted relative to a front of a driver's seat in a vehicle.

4. The keyless entry system according to claim 3, wherein the receiver is integrally or externally mounted to the combination meter.

5. The keyless entry system according to claim 2, wherein the connection interface comprises a connector having at least two conductive terminals, and at least one of the two conductive terminals is for connecting the at least one layer of the first multilayer substrate and at least one layer of the second multilayer substrate to the common ground.

6. A receiver and controller combination for a keyless entry system, comprising:

a receiver formed on a first multilayer substrate; and a controller formed on a second multilayer substrate and electrically connected to the receiver, wherein the receiver and controller are connected to a common ground, and at least one layer of the first multilayer substrate and at least one layer of the second multilayer substrate are electrically connected to the common ground so as to exhibit a mirror effect for enhancing receiving sensitivity of an antenna connected to the receiver.

7. An antenna for connecting to a receiver of a keyless entry system, comprising:

a first multilayer substrate on which the receiver is formed;

a second multilayer substrate on which a controller is formed;

wherein at least one layer of the first multilayer substrate and at least one layer of the second multilayer substrate are electrically connected to a common ground, and the electrically connected layer of the first multilayer substrate and layer of the second multilayer substrate exhibit a mirror effect for enhancing receiving sensitivity of the antenna connected to the receiver.

* * * * *